US010700392B2

(12) United States Patent
Pantel et al.

(10) Patent No.: US 10,700,392 B2
(45) Date of Patent: Jun. 30, 2020

(54) GALVANIC CELL AND METHOD FOR PRODUCING A GALVANIC CELL

(71) Applicant: Robert Bosch GmbH, Stuttgart (DE)

(72) Inventors: Daniel Pantel, Ditzingen (DE); Fabian Henrici, Palo Alto, CA (US); Nicola Mingirulli, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 202 days.

(21) Appl. No.: 15/525,449

(22) PCT Filed: Sep. 28, 2015

(86) PCT No.: PCT/EP2015/072256
§ 371 (c)(1),
(2) Date: May 9, 2017

(87) PCT Pub. No.: WO2016/074844
PCT Pub. Date: May 19, 2016

(65) Prior Publication Data
US 2017/0324120 A1 Nov. 9, 2017

(30) Foreign Application Priority Data

Nov. 10, 2014 (DE) .................. 10 2014 222 896

(51) Int. Cl.
*B81B 3/00* (2006.01)
*H01M 10/48* (2006.01)
(Continued)

(52) U.S. Cl.
CPC ........... *H01M 10/48* (2013.01); *B81B 3/0021* (2013.01); *H01M 2/34* (2013.01);
(Continued)

(58) Field of Classification Search
CPC ............. H01M 10/48; H01M 10/0525; H01M 10/052; H01M 2220/20; H01M 2/34;
(Continued)

(56) References Cited

U.S. PATENT DOCUMENTS 4,665,754 A * 5/1987 Glenn ................... G01L 9/0054
29/621.1
2003/0203280 A1* 10/2003 Hamada .............. H01M 2/0237
429/185
(Continued)

FOREIGN PATENT DOCUMENTS

DE 102012207999 11/2013
DE 102012213697 2/2014
(Continued)

OTHER PUBLICATIONS

SGA (ASIC Online May 29, 2009).{http://www.sga.se/website/files/SGA-AnalogASICCutsCost.pdf}).*
(Continued)

*Primary Examiner* — Jonathan G Leong
*Assistant Examiner* — Aaron J Greso
(74) *Attorney, Agent, or Firm* — Michael Best & Friedrich LLP

(57) ABSTRACT

The invention relates to a galvanic cell (2) comprising a housing (4) which is equipped with at least one cell coil or a cell stack and comprising a sensor (16) for detecting the pressure of the galvanic cell (2). The housing (4) has a recess which is formed from a through-opening between an interior and an exterior of the cell (2), and the sensor (16) is arranged outside of the cell (2) so as to be secured directly or indirectly to the cell. The sensor (16), in particular a micro electromechanical system, is in contact with the interior of
(Continued)

the galvanic cell (2) via the recess. The invention additionally relates to a method for producing such a galvanic cell (2).

13 Claims, 2 Drawing Sheets

(51) Int. Cl.
*H01M 2/34* (2006.01)
*H01M 10/42* (2006.01)
*H01M 10/0525* (2010.01)

(52) U.S. Cl.
CPC ....... *H01M 10/0525* (2013.01); *H01M 10/42* (2013.01); *B81B 2201/0264* (2013.01); *H01M 2220/20* (2013.01)

(58) Field of Classification Search
CPC . B81B 3/0021; B81B 3/00; B81B 2201/0264; B81B 2201/02
See application file for complete search history.

(56) References Cited

U.S. PATENT DOCUMENTS

| | | | | |
|---|---|---|---|---|
| 2005/0252302 | A1* | 11/2005 | Muchow | G01L 9/0054 73/754 |
| 2009/0011324 | A1* | 1/2009 | Heinrich | H01M 2/0267 429/90 |
| 2011/0273809 | A1* | 11/2011 | Falsett | H01M 10/0525 361/104 |
| 2012/0021276 | A1* | 1/2012 | Takatsuka | H01M 10/052 429/163 |
| 2013/0295419 | A1* | 11/2013 | Kwon | G01R 31/36 429/10 |
| 2014/0038004 | A1 | 2/2014 | Didra et al. | |
| 2014/0170446 | A1* | 6/2014 | Elian | G01M 3/227 429/61 |
| 2014/0342193 | A1* | 11/2014 | Mull | H01M 10/4257 429/50 |

FOREIGN PATENT DOCUMENTS

| | | | |
|---|---|---|---|
| DE | 102012223720 | 6/2014 | |
| DE | 102013113909 | 6/2014 | |
| EP | 2557615 | 2/2013 | |
| EP | 2600443 | 6/2013 | |
| JP | H09-120845 | * 5/1997 | ............ H01M 10/48 |
| JP | H09147927 A | 6/1997 | |
| JP | 2001345123 A | 12/2001 | |
| JP | 2005315890 A | 11/2005 | |
| JP | 2012074198 | 4/2012 | |

OTHER PUBLICATIONS

JP H09 120845 Human translation (USPTO partial translation, paragraphs [0029]-[0057]) printed Feb. 25, 2019.*
Japanese to English, USPTO translation JP H09-120845 of paragraph 0041 Mar. 26, 2020.*
International Search Report for Application No. PCT/EP2015/072256 dated Dec. 22, 2015 (English Translation, 2 pages).

* cited by examiner

GALVANIC CELL AND METHOD FOR PRODUCING A GALVANIC CELL

BACKGROUND OF THE INVENTION

The invention relates to a galvanic cell and a method for producing a galvanic cell.

At present, the monitoring of the operating state, such as voltages and temperatures, on battery cells for electric vehicles is done by externally attached sensors. As part of continuing progress, it is becoming more important to perform a more accurate measurement, or to measure new kinds of measurement quantities. One of these important measurement quantities for checking the state of health of the battery is the internal battery pressure, since a rise in pressure in the cell points to a malfunction and an imminent failure. The realization of such a measurement can be done by placing a pressure sensor in the cell.

The environmental conditions inside the battery cell are not readily suitable for classical packaging materials, casting compounds, circuit boards, adhesives or gels. On the other hand, typical media-resistant sensor concepts such as for the exhaust gas channel or the transmission oil of a vehicle are unsuitable on account of the distinctly different chemistry of a battery electrolyte.

There is an interest in developing galvanic cells with sensors for monitoring the health and safety of the galvanic cell, especially with sensors to detect the pressure of the galvanic cell.

From JP 2012-074198 there is known an energy generating device with a plurality of battery modules in which the impairment of the battery module is recognized by a pressure measurement in the battery module. The pressure sensor here is a pressure-sensitive switch making use of a conductive rubber.

From DE 10 2012 207 999 A1 there is disclosed a pressure sensor in a so-called pouch cell, wherein the pressure sensor can be designed as a microelectromechanical system. The pressure sensor is glued to the flexible film pouch, either from inside or outside the cell.

SUMMARY OF THE INVENTION

In a galvanic cell according to the invention with a housing, in which at least one cell coil or one cell stack and possibly a liquid or gaseous electrolyte is contained, and with a sensor for detecting the pressure of the galvanic cell, it is provided that the housing has a recess, which is designed as a through opening between an interior and an exterior of the cell, that the sensor is arranged outside the cell so as to be fastened directly or indirectly to the housing, especially to the lid of the housing, and that the sensor stands in contact via the recess with the interior of the galvanic cell and possibly with the liquid or gaseous electrolyte of the galvanic cell.

Advantageously, the sensor according to the invention has direct contact with the interior of the cell and can directly measure the pressure in the galvanic cell. Yet the sensor is arranged outside the housing, in order to simplify the electrical contacting.

According to the invention, furthermore, the sensor is a microelectromechanical system (MEMS). The microelectromechanical system in the context of the invention can also be called a microsystem. It comprises a miniaturized device, a subassembly or a structural part having components preferably in the micrometer range which interact as a system. The microelectromechanical system comprises at least one pressure sensor, and also optionally actuators and an electronic control unit on a chip. For example, such a microelectromechanical system can be produced on a substrate, such as silicon or gallium arsenide. Microelectromechanical systems have the advantage of being able to be manufactured at especially low cost on account of their size. They offer a broad array of functions thanks to the integration of electrical and non-electrical functions. Thus, the pressure sensor can be designed for example as a piezoresistive pressure sensor, a piezoelectric pressure sensor, a pressure sensor with a Hall effect device, a capacitive or an inductive pressure sensor, where a piezoresistive pressure sensor forms a preferred embodiment.

The recess of the housing preferably has dimensions on the order of magnitude of 0.1 mm to 5 mm, where the figures in the case of a round cross section pertain to a diameter or to a radius and in the case of a rectangular cross section to an edge length.

According to one preferred embodiment, the pressure sensor is connected to an evaluation unit by at least one, preferably a plurality of first bonding wires. Since the pressure sensor is located outside the cell, the fastening of the first bonding wires can be done before or after the making of the housing, especially after inserting the cell coil into the housing and closing the housing with the housing lid.

The evaluation unit can comprise, for example, an application-specific integrated circuit (ASIC) or a microprocessor, which can be arranged on the housing, especially on the housing lid, or on a circuit board in proximity to the pressure sensor. The circuit board can have further electrical conductors, associated with sensors for the determining of further operating parameters of the galvanic cell, such as sensors for determining the voltage or the temperature. In principle, the pressure sensor can be arranged both on a top side and on a lateral surface of the cell, but preferably in proximity to the other electronic components so that the integration of the electrical conductors with the other electronic components on the shared circuit board can be done. Usually the sensor is installed in the area of the terminals, which at the same time is a typical installation site for voltage sensors.

Preferably the galvanic cell is a prismatic galvanic cell, yet the invention is not limited to this design. Round cells and flat cells are also conceivable. According to a further preferred embodiment, the housing consists of a shape-stable material, such as aluminum.

According to one embodiment, the galvanic cell comprises a base element having a recess which forms together with the recess of the housing the through opening between the interior and the exterior of the cell, while the base element couples the sensor to the housing. The recess of the base element is preferably congruent or roughly congruent with the recess of the housing. Thus, the sensor is fastened directly to the base element and the base element in turn is fastened directly to the housing. It can be provided that the base element is soldered or glued onto the housing, especially the housing lid, and that the sensor is soldered on, bonded or glued to the base element.

According to one embodiment, the base element is made from a glass. The placement of the glass base element on the aluminum housing, especially on an aluminum housing lid, can be done by soldering or by gluing. The placement of the sensor on the base element can likewise be done by soldering, since the soldering and bonding of silicon on glass is also possible in principle and constitutes a preferred embodiment.

The base element, especially made of glass, is provided with an electrolyte-resistant protective layer, for example by means of a coating process. It may be provided that only the recess of the base element is coated with the electrolyte-resistant protective layer or that additionally boundary surfaces between the base element and the sensor and/or between the base element and the housing are coated. In addition or alternatively, it may be provided that the sensor has an electrolyte-resistant protective layer.

In the case of lithium ion batteries, a coating is used which protects against hydrofluoric acid. For example, the coating can comprise $Al_2O_3$, nickel-chromium-iron alloys or molybdenum alloys. The coating can be done for example by CVD (chemical vapor deposition), PVD (physical vapor deposition), or also by a sputtering process, with CVD, especially ALD (atomic layer deposition) being preferred.

According to one embodiment, the housing has a housing lid, forming one wall of the housing. The sensor is preferably fastened directly or indirectly to the housing lid.

According to one preferred embodiment, the housing has a bursting membrane. According to one embodiment, the sensor is fastened directly or indirectly to the bursting membrane. The bursting membrane can be arranged in particular on the housing lid. The bursting membrane is typically thinner than the surrounding areas, especially thinner than the housing lid. Advantageously, thanks to this measure, the thermomechanical stress on the sensor is reduced.

According to one preferred embodiment, the sensor and optionally the evaluation electronics or at least a part of the evaluation electronics, such as an ASIC, is arranged beneath a protective housing. Alternatively, the sensor and optionally a part or the entire evaluation electronics can be embedded in a casting compound. The protective housing in this case can have any desired shape, in particular, a space-saving design.

According to another aspect of the invention, a method for producing a galvanic cell with a housing, in which at least one cell coil or one cell stack and in which optionally a liquid or gaseous electrolyte is contained, and with a sensor for detecting the pressure of the galvanic cell, wherein the sensor is a microelectromechanical system, involves the steps:

a) providing of the housing lid with a recess, which is designed as a through opening between an interior and an exterior of the cell, b) fastening of the sensor outside the cell directly or indirectly to the housing lid, so that the sensor can stand in contact via the recess with the interior of the galvanic cell, c) wire bonding of the sensor to produce an electrical connection to evaluation electronics, optionally embedding or encapsulating of the sensor, and d) fastening of the housing lid to a housing body of the cell.

The galvanic cell is suitable for use in a battery module and/or in a battery pack in which the battery cells or storage cells are typically spatially compressed and interconnected by circuitry. For example, several modules can form a battery direct converter and several battery direct converters can form a battery direct inverter, which is designed to operate a drive system of a motor vehicle. The motor vehicle can be designed as a pure electric vehicle and solely comprise an electrical drive system. Alternatively, the motor vehicle can be designed as a hybrid vehicle, comprising an electrical drive system and an internal combustion engine. In certain variants, it can be provided that the battery of the hybrid vehicle can be charged internally with surplus energy of the internal combustion engine via a generator. Externally chargeable hybrid vehicles (plug-in hybrid electric vehicles, PHEV) additionally have the option of charging the battery through the external power grid.

BRIEF DESCRIPTION OF THE DRAWINGS

Exemplary embodiments of the invention are presented in the drawings and explained more closely in the following description. There are shown.

DETAILED DESCRIPTION

In the following description of the sample embodiments of the invention, the same or similar components are designated with the same or similar reference numbers, with no repeat description of these components in individual cases. The figures merely represent the subject matter of the invention schematically.

Figure 1:
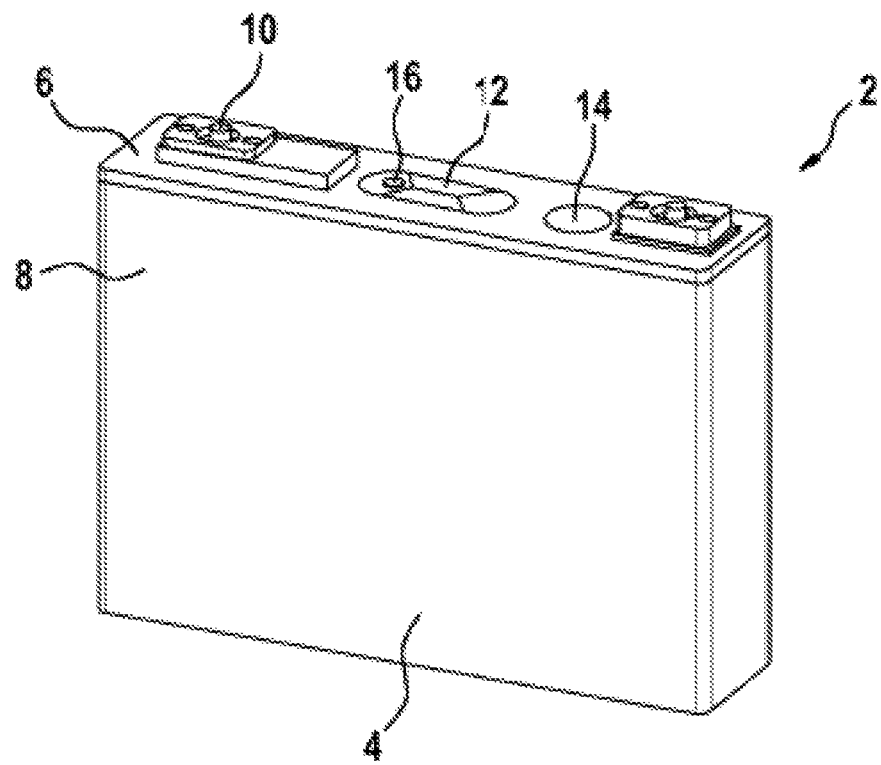
FIG. 1, a prismatic battery cell according to one embodiment of the invention.

FIG. 1 shows a galvanic cell 2 according to one embodiment of the invention. The galvanic cell 2 is also simply called cell 2 in the following.

The galvanic cell 2 comprises a housing 4, which includes a housing lid 6 and a housing body 8. In the housing 4, one or more cell coils or a cell stack are arranged, which cannot be seen in the perspective exterior view of the galvanic cell 2 in FIG. 1.

The galvanic cell 2 represented is a prismatic galvanic cell 2 known in principle, such as a lithium ion cell, which is hooked up with further galvanic cells 2 to form modules, for example in electric and hybrid vehicles, in order to provide the vehicle propulsion. Terminals 10 are arranged on the housing lid 6, along with a bursting membrane 12 and a fill opening 14. By the terminals 10, the galvanic cell 2 makes electrical contact with the outside. The fill opening 14 and the bursting membrane 12 are arranged substantially at the center of the housing lid 6, while the terminals 10 are situated more peripherally.

During the production process, the cell coils or the cell stack are inserted into the housing 4. After this, the housing 4 is closed with the housing lid 6, for example by welding. In the case of the lithium ion cell depicted, a liquid or gaseous electrolyte is poured vertically through the fill opening 14 and then goes into the cell coils, which become soaked with the electrolyte.

A sensor 16 is fastened to the housing 4, especially to the housing lid 6, especially to the bursting membrane 12, being designed to detect the pressure of the galvanic cell 2. The sensor 16 on the one hand has direct contact with the interior 22 of the galvanic cell 2 and on the other hand is arranged outside the housing 4, which allows for an especially easy electrical contact.

Figure 2:
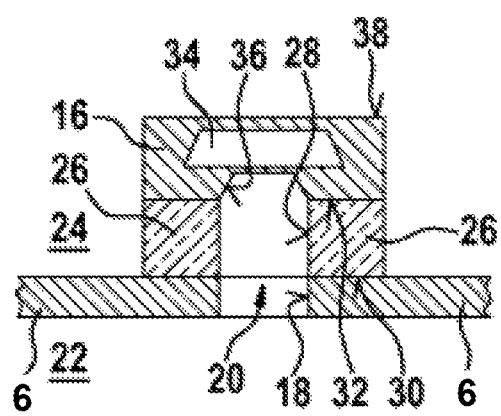
FIGS. 2 to 6 are detail views of a housing of a galvanic cell with sensors arranged thereon according to different embodiments of the invention.

FIG. 2 shows a detail view of the housing 4 of the galvanic cell 2, which has been described in relation to FIG. 1. The section of the housing 4 need not necessarily be associated with the bursting membrane 12, as represented in FIG. 1, but instead it can of course be any desired part of the housing 4, with the arrangement on the housing lid 6 being preferred.

The housing 4 has a recess 18, forming a through opening 20 between an interior 22 and an exterior 24 of the cell 2. In the area around the recess 18 of the housing 4, a base element 26 is arranged, which likewise has a recess 28, which likewise forms the through opening 20 between the interior 22 and the exterior 24 of the cell 2. The base element 26 and the housing 4 touch each other at a first boundary surface 30 and are for example glued, soldered, or welded together at the first boundary surface 30.

The base element 26 is made of glass, for example of a lime and soda glass, which can contain silicon dioxide, sodium oxide, and calcium oxide fractions, in particular of normal glass with a chemical composition of $Na_2O\cdot CaO\cdot 6SiO_2$. The base element 26 furthermore can have boron oxide and/or aluminum oxide fractions in order to increase the resistance to water, acids and alkalis. For example, it can also be a borosilicate glass, for which a good chemical resistance and a slight coefficient of thermal expansion can be expected.

The sensor 16 is arranged on the base element 26, for example, soldered or bonded to it. The sensor 16 is a sensor 16 of the first type, being designed for an absolute pressure measurement. For this, the sensor 16 has a reference volume 34 with a known pressure, such as 1 mbar.

The base element 26 and the sensor 16 touch each other at a second boundary surface 32.

The sensor 16 has a first contact region 36, which stands in direct contact with the interior 22 of the cell 2, so that the pressure inside the housing 4 can be measured directly. In particular, the sensor 16 in the first contact region 36 stands in contact via the through opening 20 with the interior 22 of the galvanic cell 2 and optionally with the liquid or gaseous electrolyte situated in the interior 22 of the housing 4.

The base element 26 also stands in contact in the region of its recess 28, which also forms the through opening 20, with the interior 22 of the cell 2 and optionally with the liquid or gaseous electrolyte. Therefore, in the region of the recess 28 it can be provided that the base element 26 has a coating, especially in the event that the base element 26 is made of glass. The coating can also be extended to the sensor 16 and to the second boundary surface 32 between the base element 26 and the sensor 16 and/or to the first boundary surface 30 between the base element 26 and the housing 4.

The sensor 16 furthermore has an outer region 38 which stands in direct contact with the exterior 24 of the housing 4 or the cell 2. Through the outer region 38 of the sensor 16, the electrical contacting of the sensor 16 occurs, as is described more closely in reference to FIGS. 5 and 6.

Figure 3:
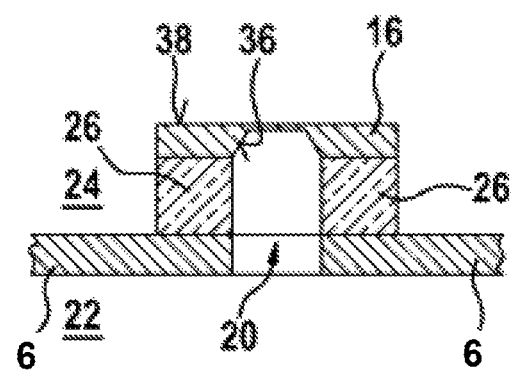

FIG. 3 shows, like FIG. 2, a detail view of the housing 4 of the galvanic cell 2 according to the invention, while in this case the sensor 16 is a sensor 16 of a second type and is designed for relative pressure measurement. The sensor 16, once again, is indirectly coupled to the housing 4 across the base element 26 and comprises, as described in reference to FIG. 2, the first contact region 36 and the outer region 38, by which the sensor 16 stands in direct contact on the one hand with the interior 22 of the cell 2 and on the other hand with the exterior 24 of the cell 2. In contrast with the embodiment in FIG. 2, the sensor 16 of the second type has no reference volume 34, so that the measurement is done relative to the outside pressure.

Figure 4:
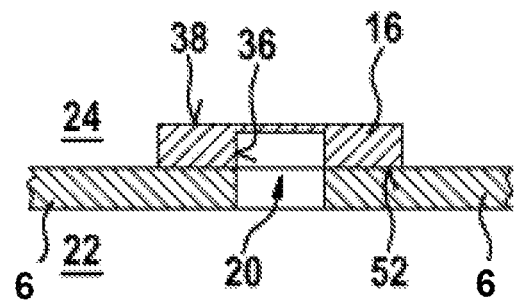

FIG. 4 shows a further embodiment in which the sensor 16, here for example again the sensor 16 of the second type for the relative pressure measurement from FIG. 3, is coupled directly to the housing 4 by a third boundary surface 52, while no base element 26 is used as compared with the embodiments described in reference to FIGS. 2 and 3.

Figure 5:
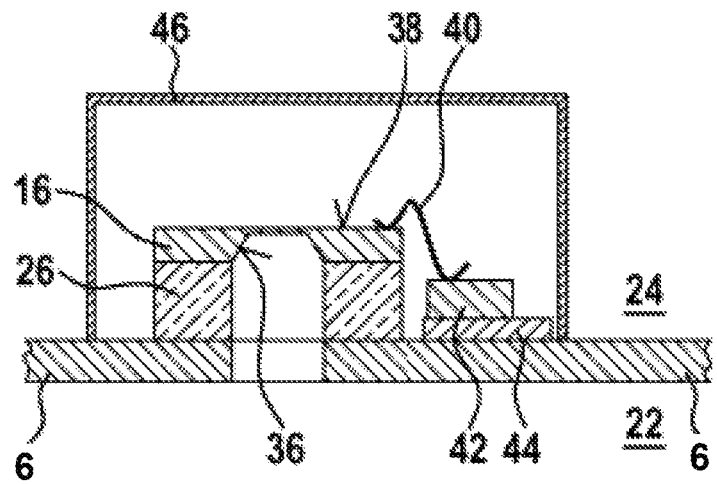

FIG. 5 shows another sample embodiment of the galvanic cell 2, where the arrangement described in reference to FIG. 3 has been expanded with additional elements.

The sensor 16 is coupled by means of first bonding wires 40 to an ASIC 42, which is located on a circuit board 44. Both the sensor 16 and an evaluation unit, which comprises the ASIC 42 and the circuit board 44, are located in the interior 22 of a protective housing 46, which protects them against outside influences such as pressure fluctuations or mechanical actions such as deformations. In place of the protective housing 46, a casting element can also be provided. With the casting element, the sensor 16 and the evaluation unit are enclosed by a casting compound.

Further elements can be arranged on the circuit board 44, especially further ASICs, microcontrollers, temperature sensors and/or conductor tracks for such elements.

Figure 6:
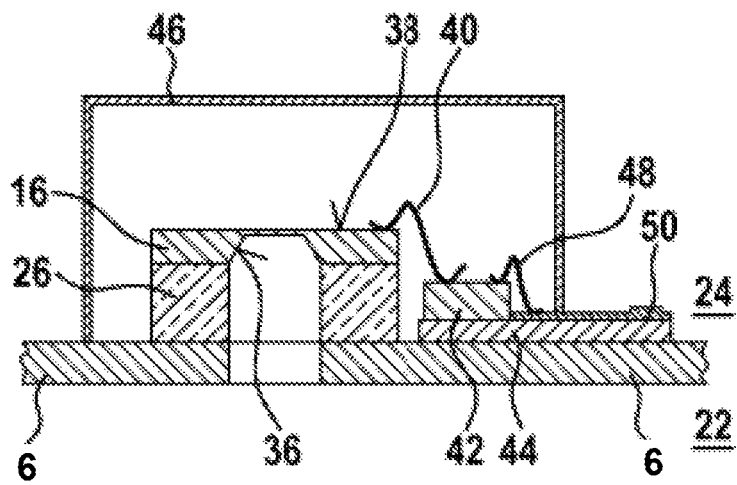

FIG. 6 shows another alternative embodiment in which only a first part of the circuit board 44 is arranged in the protective housing 46 and a second part of the circuit board 44 projects through the protective housing 46 to the outside. For the electrical contacting with the outside, a contact pad 50 is provided on the second part of the circuit board 44. The ASIC 42 is joined to the contact pad 50 by second bonding wires 48. Alternatively, solder balls can also be provided.

The invention is not confined to the sample embodiments described here and the aspects pointed out therein. Instead, many modifications are possible within the field indicated by the claims, falling within the scope of the ordinary skilled person.

What is claimed is:

1. A galvanic cell (2) comprising a housing (4), in which at least one cell coil or one cell stack is contained, having a body (8) and a lid (6) that closes an opening of the body (8), and comprising a sensor (16) for detecting a pressure of the galvanic cell (2), wherein the lid (6) has a recess (18), which is a through opening (20) between an interior (22) and an exterior (24) of the cell (2), wherein the sensor (16) is arranged outside the lid (6), wherein a base element (26) secures the sensor (16) to the exterior (24) of the lid (6), the base element directly contacting both of the sensor (16) and the lid (6), wherein the sensor (16) communicates with the interior (22) of the galvanic cell (2) via the through opening (20), wherein no portion of the sensor (16) or the base element (26) extends into the interior (22) of the cell (2), wherein the sensor (16) is a microelectromechanical system, and wherein the sensor (16) is connected to an evaluation unit by at least one first bonding wire (40).

2. The galvanic cell (2) as claimed in claim 1, wherein the sensor (16) is configured to provide a relative pressure measurement or wherein the sensor (16) has a reference volume (34) and is configured to provide an absolute pressure measurement.

3. The galvanic cell (2) as claimed in claim 1, characterized in that the galvanic cell (2) is a prismatic galvanic cell (2) and the housing (4) is made of a shape-stable material.

4. The galvanic cell (2) as claimed in claim 1 wherein the base element (26) has a second recess (28) which forms, together with the recess (18) of the housing (4), the through opening (20).

5. The galvanic cell (2) as claimed in claim 1, characterized in that the base element (26) is made from a glass.

6. The galvanic cell (2) as claimed in claim 1, characterized in that the base element (26) and/or the sensor (16) have an electrolyte-resistant protective layer.

7. The galvanic cell (2) as claimed in claim 1, characterized in that the sensor (16) is arranged beneath a protective housing (46), or is embedded in a casting compound.

8. A method for producing a galvanic cell (2) with a housing (4), in which at least one cell coil or one cell stack is contained, having a body (8) and a lid (6) that closes an opening of the body (8), and with a sensor (16) for detecting the pressure of the galvanic cell (2), wherein the sensor (16) is a microelectromechanical system, the method comprising the steps:

a) providing the housing lid (6) with a recess (18), which is a through opening (20) between an interior (22) and an exterior (24) of the cell (2), b) fastening the sensor (16) outside the housing lid (6) and to the housing lid (6) via a base element (26) disposed between the sensor (16) and the housing lid (6) in direct contact with both of the sensor (16) and the lid (6), so that the sensor (16) communicates with the interior (22) of the galvanic cell (2) via the recess (18), wherein no portion of the sensor (16) or the base element (26) extends into the interior (22) of the galvanic cell (2), c) wire bonding the sensor (16) to produce an electrical connection to evaluation electronics, and d) fastening the housing lid (6) to the housing body (8) of the cell (2) to close the opening of the body (8).

9. The galvanic cell (2) as claimed in claim 2, wherein the sensor (16) is configured to provide a relative pressure measurement.

10. The galvanic cell (2) as claimed in claim 2, wherein the sensor (16) has a reference volume (34) and is configured to provide an absolute pressure measurement.

11. The galvanic cell (2) as claimed in claim 7, characterized in that the sensor (16) is arranged beneath a protective housing (46).

12. The galvanic cell (2) as claimed in claim 7, characterized in that the sensor (16) is embedded in a casting compound.

13. A galvanic cell (2) comprising a housing (4), in which at least one cell coil or one cell stack is contained, having a body (8) and a lid (6) that closes an opening of the body (8), and comprising a sensor (16) for detecting a pressure of the galvanic cell (2), wherein the lid (6) has a recess (18), which is a through opening (20) between an interior (22) and an exterior (24) of the cell (2), wherein the sensor (16) is arranged outside the lid (6) and secured directly or indirectly to the exterior (24) of the lid (6), wherein the sensor (16) communicates with the interior (22) of the galvanic cell (2) via the through opening (20), wherein the sensor (16) is a microelectromechanical system, wherein the sensor (16) is connected to an evaluation unit by at least one first bonding wire (40), wherein the evaluation unit includes an ASIC (42) located on a circuit board (44), and wherein the sensor (16) is coupled to the ASIC (42) via the at least one first bonding wire (40), and wherein the evaluation unit and the sensor (16) are located within one of a protective housing (46) attached to the exterior of the lid or a casting element attached to the exterior of the lid, wherein a base element secures the sensor to the exterior of the lid, and wherein no portion of the sensor or the base element extends into the interior of the cell.

* * * * *